(12) United States Patent
Lin

(10) Patent No.: US 12,295,114 B2
(45) Date of Patent: May 6, 2025

(54) EXPANSION CARD FIXING STRUCTURE AND ELECTRONIC DEVICE USING THE SAME

(71) Applicant: Fulian Precision Electronics (Tianjin) Co., LTD., Tianjin (CN)

(72) Inventor: Jia-Feng Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 197 days.

(21) Appl. No.: 18/129,010

(22) Filed: Mar. 30, 2023

(65) Prior Publication Data

US 2024/0147647 A1 May 2, 2024

(30) Foreign Application Priority Data

Oct. 28, 2022 (CN) .......................... 202211339694.2

(51) Int. Cl.
  *H05K 7/14*      (2006.01)
(52) U.S. Cl.
  CPC ......... *H05K 7/1417* (2013.01); *H05K 7/1489* (2013.01)
(58) Field of Classification Search
  None
  See application file for complete search history.

(56) References Cited

U.S. PATENT DOCUMENTS

| 10,645,835 B1 * | 5/2020 | Sauer ................... H05K 7/1461 |
| 2021/0153373 A1 * | 5/2021 | Chen ........................ H05K 7/02 |

FOREIGN PATENT DOCUMENTS

| CN | 101078945 A | 11/2007 |
| TW | I717120 B | 1/2021 |

* cited by examiner

*Primary Examiner* — James Wu
*Assistant Examiner* — Christopher L Augustin
(74) *Attorney, Agent, or Firm* — ScienBiziP, P.C.

(57) ABSTRACT

The present disclosure includes an expansion card fixing structure and electronic device using the same. The guiding track includes a track base, the track base includes a track slot, the track slot extends in a first direction, and the track slot portions of the track base recessed in a second direction to form the track slot. A limiting element includes a first end and a second end at intervals along a third direction. The first end extends into the track slot along the third direction, the second end forms an avoidance hole through the second direction. A handle includes a first surface and a second surface, the handle is connected to the second surface by a latch. A resilient member is configured for driving the first end into the track slot. An expansion plate includes a guide portion.

18 Claims, 10 Drawing Sheets

EXPANSION CARD FIXING STRUCTURE AND ELECTRONIC DEVICE USING THE SAME

FIELD

The subject matter relates to the field of electronic products, and in particular, to expansion card fixing structures and electronic devices using the same.

BACKGROUND

In order to adapt to the development of the server, it is necessary to set up a pluggable structure for the expansion card in the server. In the prior art, before the expansion card is inserted into the chassis, the top cover must be opened and the card hook on the expansion card fixing module must be unbuttoned before the expansion card can be inserted into the chassis, and then the expansion card can be fixed using the card hook on the expansion card fixing module. The pluggable structure of the expansion device in the prior art requires multiple steps such as opening the cover, unhooking, and pressing the buckle during installation, which makes the operation process more complicated.

DETAILED DESCRIPTION

Figure 1:
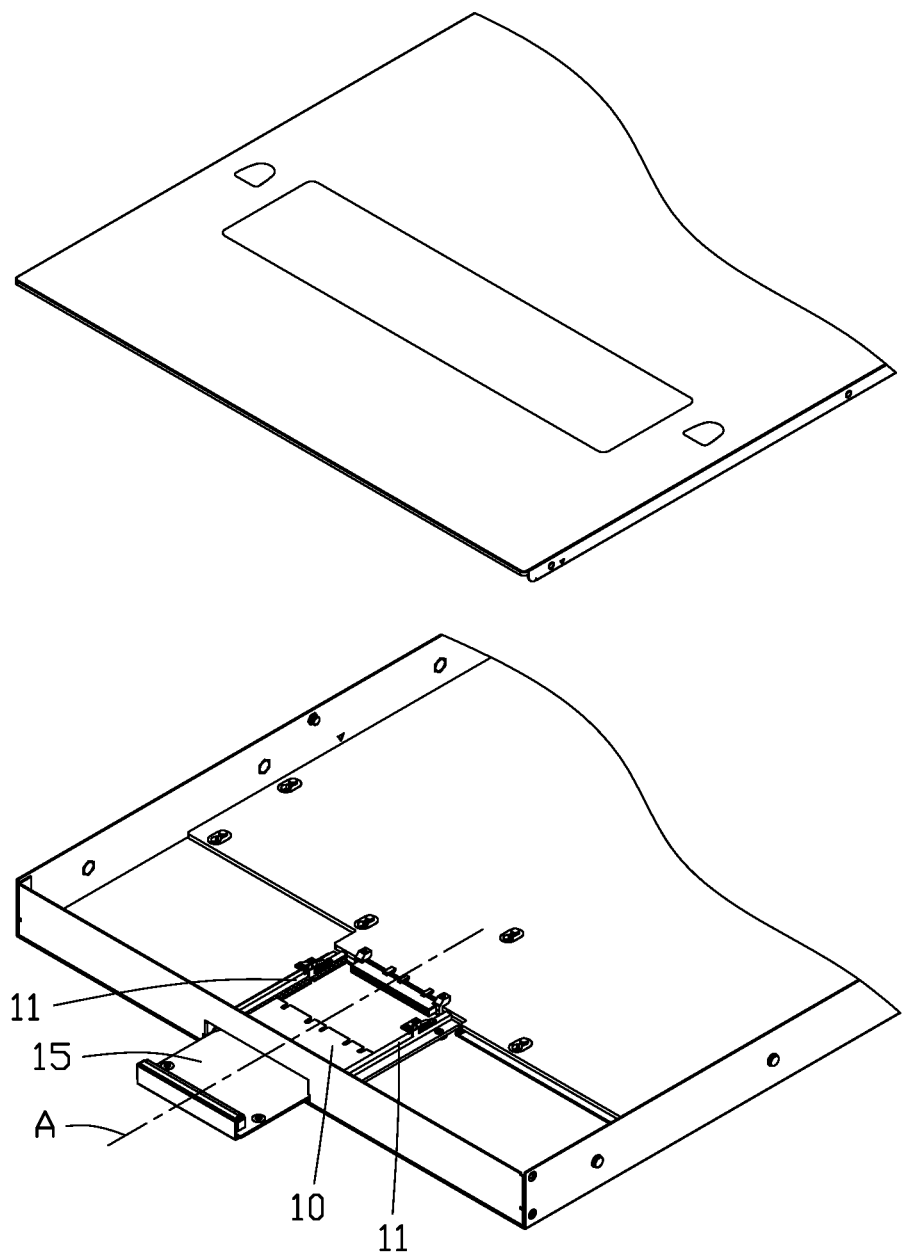
FIG. 1 shows a schematic view of an expansion card fixing structure provided to the present disclosure.
Figure 2:
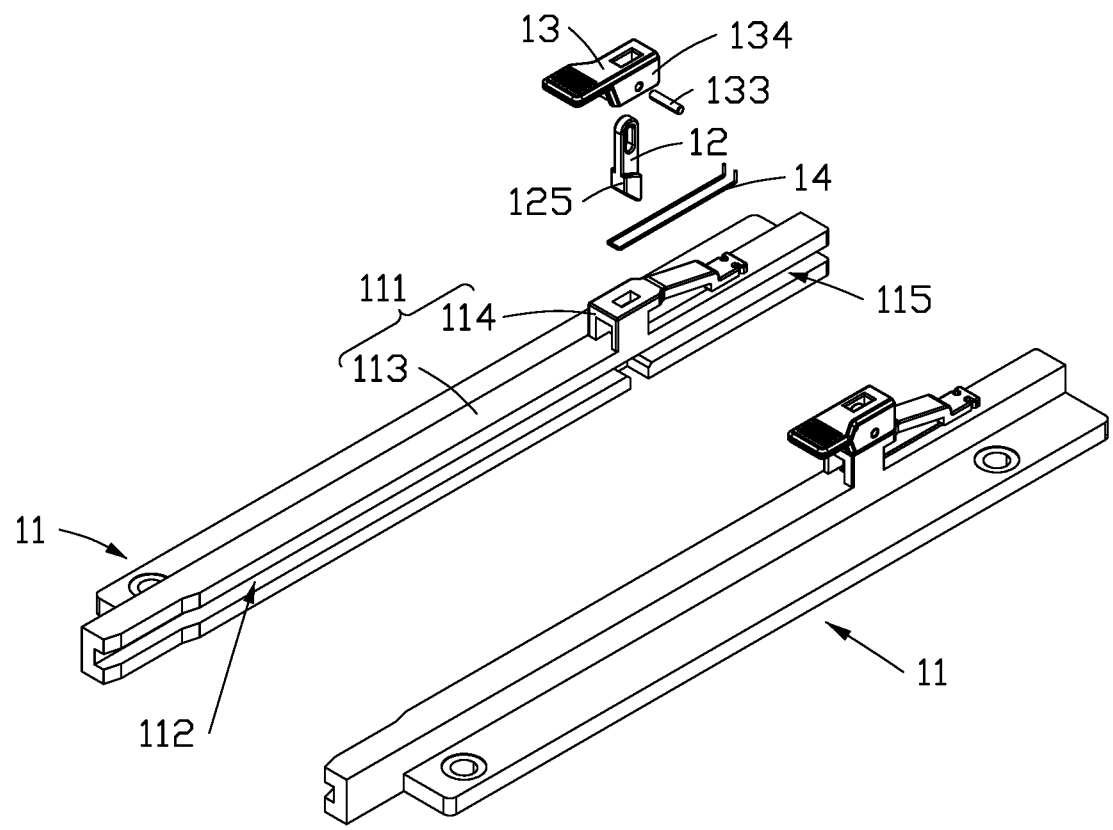
FIG. 2 is a schematic view of a structure of a guide track of the expansion card fixing structure provided to the present disclosure.
Figure 3:
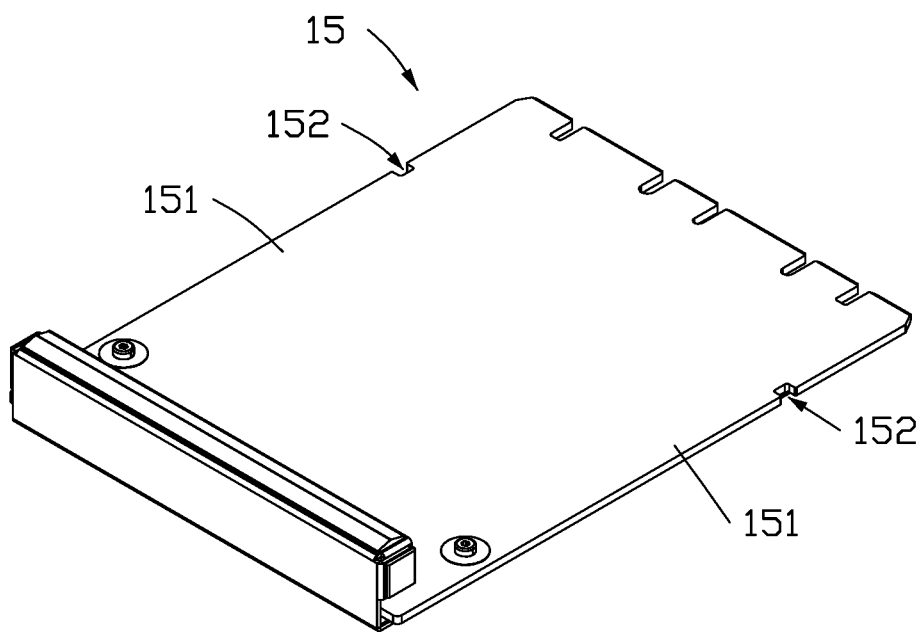
FIG. 3 is a schematic view of a structure of an expansion plate of the expansion card fixing structure provided to the present disclosure.
Figure 4:
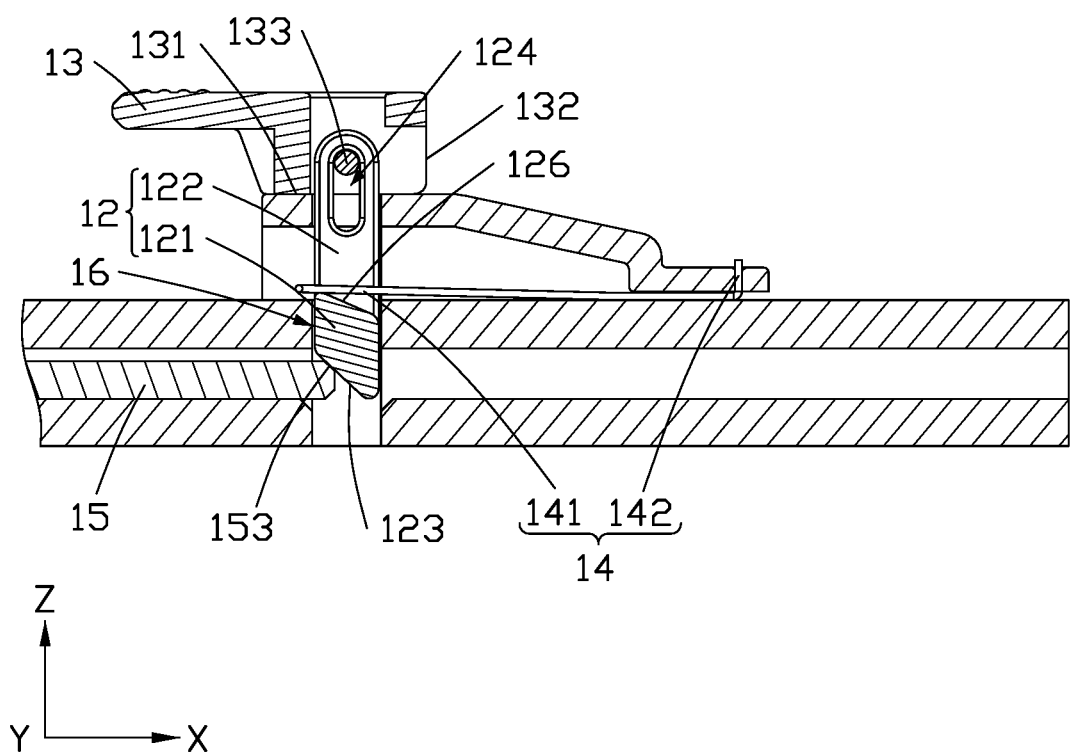
FIG. 4 is a schematic view of a working state when an expansion plate is inserted into a track slot in the expansion card fixing structure provided to the present disclosure.
Figure 5:
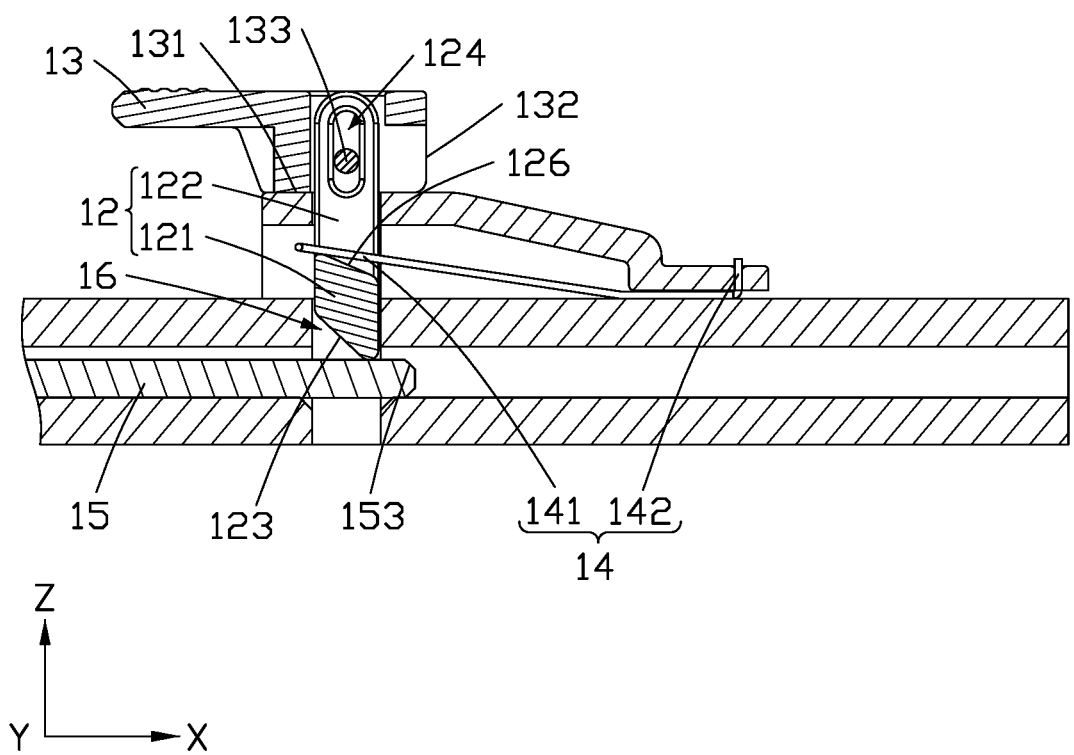
FIG. 5 shows a working state of the expansion plate when a first end of the expansion card fixing structure to the present disclosure.
Figure 6:
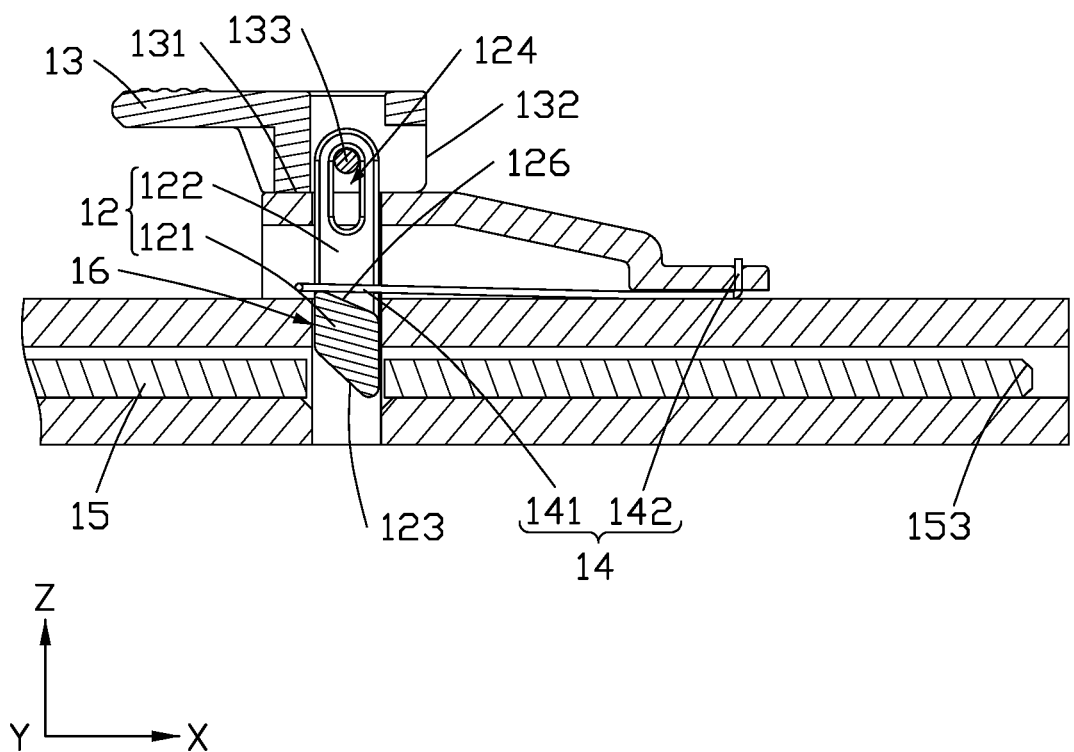
FIG. 6 is a schematic view of a working state of the first end of the expansion card fixing structure to the present disclosure when the first end falls into a first opening.
Figure 7:
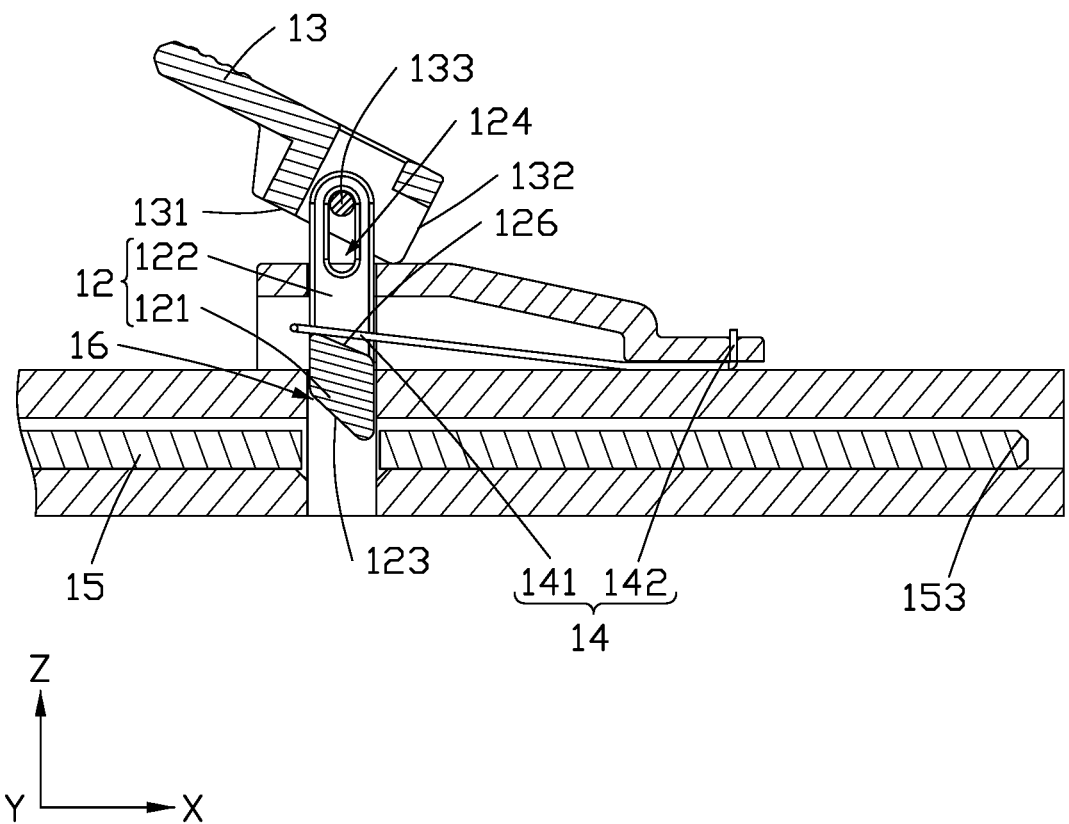
FIG. 7 is a schematic view of a working state when a first end face is disengaged from a track base by turning a handle in the expansion card fixing structure according to this application embodiment.
Figure 8:
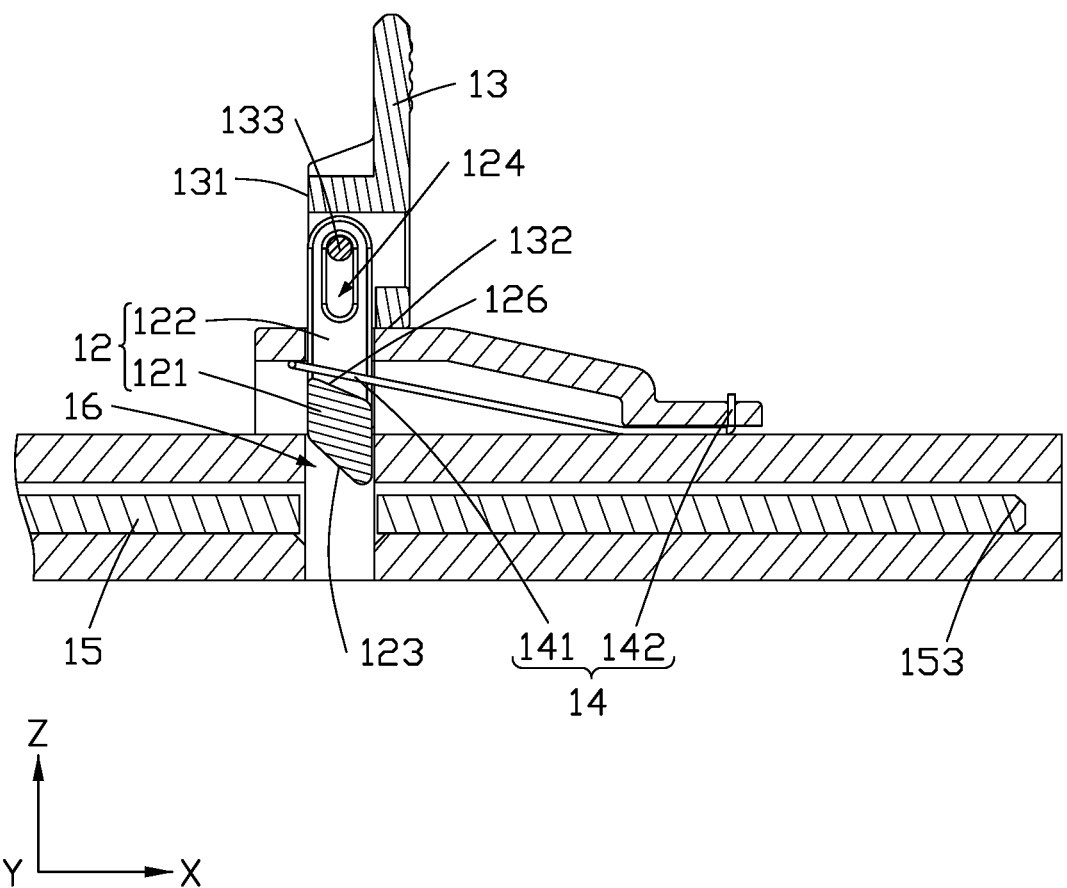
FIG. 8 is a schematic view of a working state of the expansion card fixing structure to the present disclosure when a turning handle is turned until a second end surface is in contact with the track base.

The following descriptions refer to the attached drawings for a more comprehensive description of this application. Sample embodiments of this application are shown in the attached drawings. However, this application can be implemented in many different forms and should not be construed as limited to exemplary embodiments set forth herein. These exemplary embodiments are provided to make this application thorough and complete, and to adequately communicate the scope of this application to those skilled in the field. Similar view labels represent the same or similar components.

The terms used herein are intended only to describe the purpose of particular exemplary embodiments and are not intended to limit this application. As used herein, the singular forms "one", "one" and "the" are intended to include the plural as well, unless the context otherwise clearly indicates it. In addition, when used herein, the words "include" and/or "include" and/or "have", integers, steps, operations and/or components, do not exclude additional or pluralities of features, regions, integers, steps, operations, components, and/or groups thereof.

Unless otherwise defined, all terms used herein (including technical and scientific terms) have the same meaning as would normally be understood by ordinary technicians in the field of this application. In addition, unless expressly defined in the context, terms such as those defined in a general dictionary shall be construed to have meanings consistent with those in the relevant technology and in the content of this application, and shall not be construed to have idealistic or overly formal meanings.

Examples of embodiments are described below in combination with the attached drawings. It should be noted that the components depicted in the attached drawings may be shown not to scale; the same or similar components will be assigned the same or similar drawing mark representation or similar technical terms.

The following is a detailed description of the specific implementation of this application, referring to the attached drawings.

As shown in FIGS. 1 to 8, embodiments of the present application provide an expansion card fixing structure 10, the expansion card fixing structure 10 includes a guide track 11, a limiting element 12, a handle 13, a resilient member 14, and an expansion plate 15.

The guide track 11 includes a track base 111, the track base 111 includes a track slot 112, the track slot 112 extends along the first direction X, and a portion of the track base 111 is recessed along a second direction Y to form a track slot 112.

The limiting element 12 includes a first end 121 and a second end 122 spaced along the third direction Z. The first end 121 is movably extended into the track slot 112 along the third direction Z. The second end 122 is provided with an avoidance hole 124 along the second direction Y. The avoidance hole 124 extends along the third direction Z.

The handle 13 is connected to the second end 122 by a latch 133, which is provided in the avoidance hole 124. The handle 13 includes a first surface 131 and a second surface 132, and the handle 13 is capable of rotating on the axis of the latch 133, so that one of the first surface 131 and the second surface 132 is held against the track base 111. The distance of the latch 133 from the first surface 131 is less than the distance of the latch 133 from the second surface 132.

The resilient member 14 is connected to the first end 121 and the track base 111 for driving the first end 121 into the track slot 112.

The expansion plate 15 includes a guide portion 151 with a first opening 152, the guide portion 151 is provided in the track slot 112, and the first opening 152 is located in the track slot 112, and the first end 121 extends into the first opening 152 to lock the expansion plate 15.

Compared with the prior art, the expansion plate 15 carrying the expansion card chip is movably connected to the guide track 11 through the track slot 112, so that the expansion plate 15 and the guide track 11 can cooperate to achieve the insertion and removal of the expansion card. The first end 121 of the limiting element 12 extends into the guide track 11 in the third direction Z intersecting the first direction X. When the expansion plate 15 is slid in along the guide track 11, the expansion plate 15 is held against and pushes the limiting element 12 upward in the third direction Z. When the first opening 152 reaches the first end 121 of the limiting element 12, the first end 121 of the limiting element 12 falls into the first opening 152 under the drive of the elastic member 14 to realize the fixation of the expansion plate 15. When the first opening 152 reaches the first end 121 of the limiting element 12, the first end 121 of the limiting element 12 is driven by the elastic member 14 into the first opening 152 to fix the expansion plate 15. When the expansion plate 15 is removed, by the travel difference between the latch 133 and the first end surface 131 and the second end surface 132, the handle 13 is moved so that the limiting element 12 is lifted, so that the first end 121 is released from the first opening 152, and thus the expansion plate 15 is unfastened.

In one embodiment, the number of guide tracks 11 is two, and the two guide tracks 11 are at intervals. The second openings 115 of the two track slots 112 are provided facing each other. The expansion plate 15 includes two guide portions 151 disposed back-to-back along the second direction Y. Each guide portion 151 is movably disposed in one of the track slots 112.

In this embodiment, both guide tracks 11 are fixed to the electronic device 2 and the two guide tracks 11 are set parallel to each other. The two guide tracks 11 can be set symmetrically with respect to the mirror surface A. The first direction X and the third direction Z define the mirror surface A. The mirror surface A is located at the midline between the two guide tracks 11. The two guide tracks 11 on both sides of the mirror surface A have a symmetrical structure with respect to the mirror surface A. The second opening 115 of each track slot 112 is set towards the other guide track 11.

In this embodiment, the expansion plate 15 is integrally molded with the expansion card chip. The expansion card chip may include a common memory chip circuit. The expansion plate 15 may include a common insulating substrate. The memory chip circuitry is formed on the insulating substrate. The two guide portions 151 of the expansion plate 15 located on opposite sides of the mirror surface A cooperate with two opposite guide tracks 11, so that the guide tracks 11 guide the expansion plate 15 and the expansion plate 15 slides along the track slot 112.

In an embodiment, the track base 111 includes a main part 113 and a tab 114. the main part 113 is in the shape of an elongated strip. The main part 113 extends in the first direction X. The track slot 112 is provided on the side of the main part 113. The tab 114 is connected to the main part 113, and the tab 114 is raised upward in the third direction Z.

In one embodiment, the track base 111 is provided with guide holes 16 along the third direction Z. The guide holes 16 are connected to the track slot 112. The guide hole 16 is used to allow the limiting element 12 to be positioned therein. The guide hole 16 is used to guide the limiting element 12. At least a portion of the limiting element 12 is located outside the guide hole 16.

In this embodiment, the guide hole 16 runs through the tab 114 and the track base 111 along the third direction Z. The handle 13 is provided on the side of the tab 114 away from the main body part 113. In other embodiments, the guide hole 16 may directly penetrate the body part 113, and the handle 13 is provided on the surface of the body part 113 and is set corresponding to the guide hole 16.

In one embodiment, the first end 121 includes a first bevel 123, and the first bevel 123 is inclined in a direction between the opposite direction of the first direction X and the third direction Z. The first bevel 123 and the guide portion 151 are separable held against each other so that when the expansion plate 15 moves in the first direction X, the expansion plate 15 can push the first end 121 upward in the third direction Z. The limiting element 12 moves out of the track slot 112 to avoid the expansion plate 15.

In this embodiment, the head of the expansion plate 15 is provided with a second bevel 153, and the second bevel 153 may have the same inclination as the first bevel 123. The expansion plate 15 is in contact with the first end 121 and the first bevel 123 slides relative to the second bevel 153. The first end 121 moves upward in the third direction Z with the restriction of the guide hole 16, and the expansion plate 15 continues to move forward in the first direction X. In other embodiments, the second bevel 153 may also be a raised spherical surface, and the spherical surface contacts and slides relative to the first bevel 123.

In one embodiment, the second end 122 is provided with an avoidance hole 124 along the second direction Y. The avoidance hole 124 extends along the third direction Z, and the latch 133 is provided in the avoidance hole 124. The periphery of the avoidance hole 124 along the second direction Y is an open structure, and the periphery of the avoidance hole 124 along the first direction X and the third direction Z is a closed structure. The length of the inner diameter of the avoidance hole 124 along the third direction Z is greater than or equal to the distance of the first end 121 along the third direction Z for avoiding the expansion plate 15.

In this embodiment, the handle 13 and the latch 133 are located in a fixed state. When the limiting element 12 is jacked upward by the expansion plate 15 in the third direction Z, the latch 133 and the handle 13 do not move together with the second end 122. The latch 133 passes through the second end 122 through the avoidance hole 124, and when the second end 122 moves upward in the third direction Z, the latch 133 is displaced relative to the second end 122. The limiting element 12 and the latch 133 achieve avoidance through the avoidance hole 124, so that the limiting element 12 can move upward relative to the latch 133 while the latch 133 and the handle 13 remain fixed.

In one embodiment, the resilient member 14 includes a first connection end 141 and a second connection end 142 spaced along the first direction X. The first connection end 141 is connected to the limiting element 12 and the second connection end 142 is fixedly connected to the track base 111.

In one embodiment, the thickness of the first end 121 along the second direction Y is greater than the thickness of the second end 122 along the second direction Y. The first end 121 and the second end 122 are formed with a snap-in step 125 at the junction. The first connection end 141 is provided at the junction of the first end 121 and the second end 122 with a snap-in step 125, and the first connection end 141 is provided around the limiting element 12 at the snap-in step 125. The first connection end 141 is provided on the side of the first end 121 away from the track slot 112. The second connection end 142 is fixedly connected to the track base 111.

In this embodiment, there is a height difference between both sides of the second end 122 and the first end 121 along the second direction Y. The first connection end 141 surrounds the limiting element 12, and the first connection end 141 is located at the junction of the first end 121 and the second end 122. The first connection end 141 is held against a snap-in step 125 that is raised from the first end 121 compared to the second end 122.

In this embodiment, the resilient member 14 is a rigid metal wire. In the natural state, the resilient member 14 may be provided on the surface of the body part 113 in the first direction X. When the limiting element 12 is lifted up by the expansion plate 15 in the third direction Z, the mount step 125 drives the first connection end 141 upward in the third direction Z, deforming the elastic member 14. When the expansion plate 15 moves in the first direction X until the first opening 152 corresponds to the guide hole 16, the resilient member 14 pushes the clamping step 125 downward in the third direction Z so that the first end 121 extends into the first opening 152, causing the expansion plate 15 to be fixed.

In this embodiment, the snap-in step 125 may have a third bevel 126, and the third bevel 126 may have the same inclination direction as the first bevel 123. The first end 121 moves upward along the third direction Z and drives the first connection end 141 to bend upward along the third direction Z. The deformed first connection end 141 may be set along the third bevel 126.

In one embodiment, the handle 13 is provided on the side of the limiting element 12 away from the track slot 112. The handle 13 includes two fixed walls 134 spaced along the second direction Y. A second end 122 is provided between the two fixed walls 134. The latch 133 passes through both fixed walls 134 and the second end 122.

In this embodiment, the ends of the latch 133 spaced along the second direction Y are fixedly connected to the two fixed walls 134, respectively. The latch 133 passes through the avoidance hole 124 along the second direction Y, and the inner wall of the second end 122 limits the latch 133 in the third direction Z.

In one embodiment, the first surface 131 is connected to the second surface 132. The distance of the latch 133 from the second surface 132 is D2, the distance of the latch 133 from the first surface 131 is D1, and the difference of D2 minus D1 is D0. The thickness of the expansion plate 15 along the third direction Z is H0, and the value of D0 is greater than the value of H0.

In this embodiment, the first surface 131 and the second surface 132 are two connected faces. By turning the handle 13, one of the first surface 131 and the second surface 132 can be brought out of contact with the tab 114, and continuing to turn the handle 13 in the same direction can bring the other of the first surface 131 and the second surface 132 into contact with the tab 114. Since D2 is greater than D1, the distance between the latch 133 and the expansion plate 15 along the third direction Z increases, and the latch 133 drives the limiting element 12 to move upward along the third direction Z. After the movement, the latch 133 is no longer in contact with the expansion plate 15 and finally releases the limiting element 12 from limiting the expansion plate 15.

Figure 9:
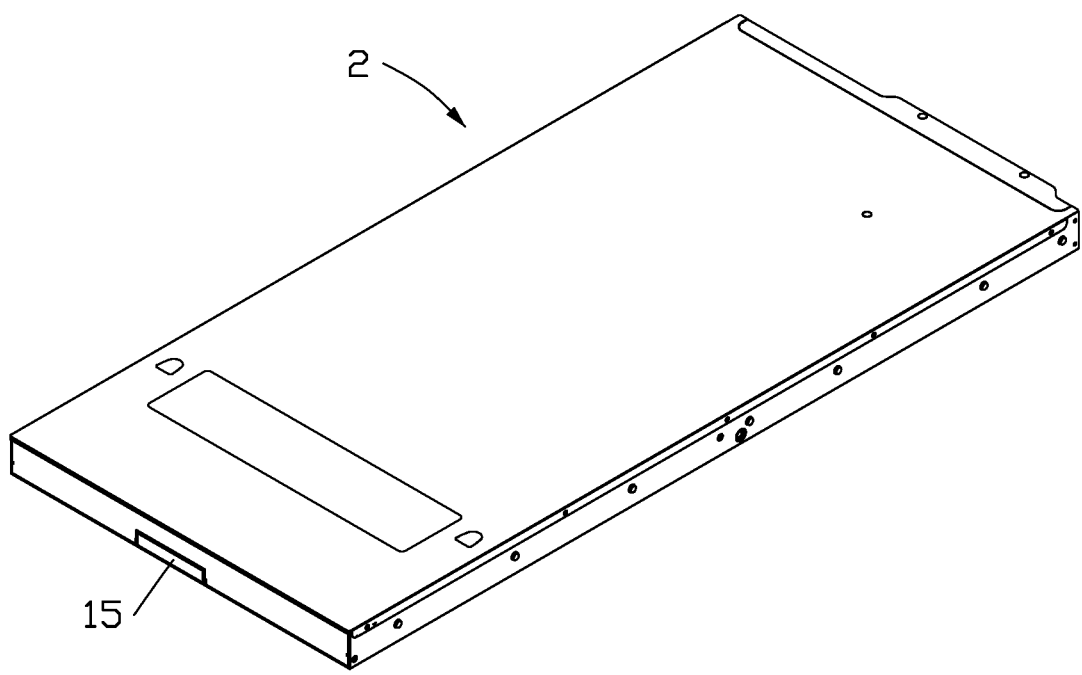
FIG. 9 is a three-dimensional schematic view of an electronic device provided to the present disclosure.
Figure 10:
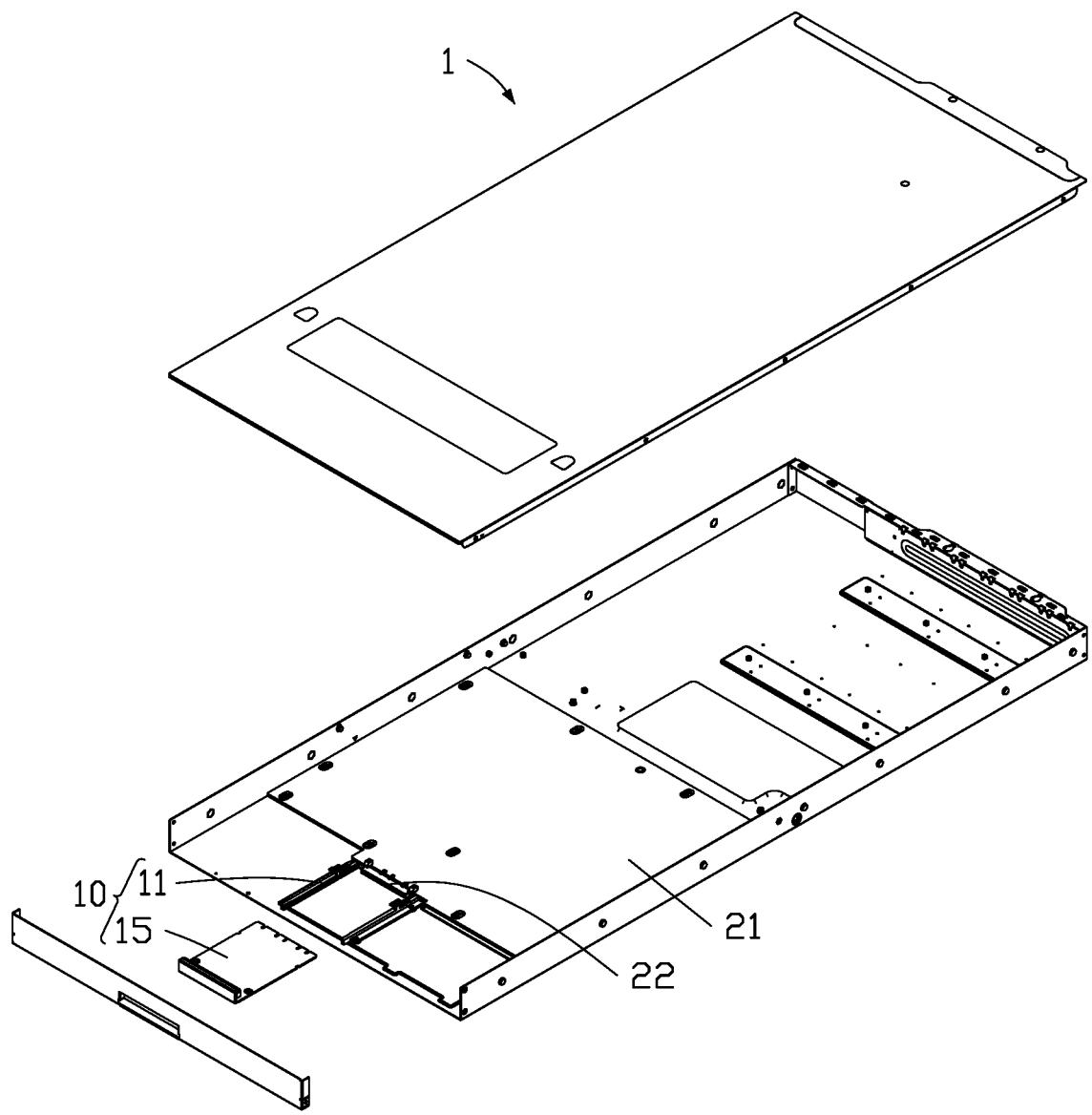
FIG. 10 is a schematic view of a three-dimensional decomposition of the electronic device of FIG. 9.

As shown in FIG. 9 and FIG. 10, the present application embodiment also provides an electronic device 2 comprising a main board 21, a connection port 22, and an expansion card fixing structure 10 as provided in the preceding embodiment, the expansion card fixing structure 10 being electrically connected to the main board 21 through the connection port 22.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An expansion card fixing structure comprising:
   at least one guiding track comprising a track base, wherein a track slot is defined on the track base, the track slot extends in a first direction, and a side of the track base is recessed in a second direction to form the track slot;
   a limiting element comprising a first end and a second end, the first end and the second end being arranged at intervals in a third direction, wherein the first end is inserted into the track slot in the third direction, an avoidance hole is defined on the second end in the second direction, the avoidance hole extends in the third direction;
   a handle comprising a first surface and a second surface, wherein the handle is connected to the second end by a latch, the latch is partially received in the avoidance hole, the handle is rotatable around an axis of the latch, and one of the first surface and the second surface is in contact with the track base, a distance from the first surface to the latch is less than a distance from the second surface to the latch;
   a resilient member connected to the first end and the track base, the resilient member being configured for driving the first end into the track slot; and
   an expansion plate comprising at least one guide portion, wherein a first opening is defined on the at least one guide portion, the guide portion is moveably inserted in the track slot, the first opening is located in the track slot, and the expansion plate is lockable by inserting the first end into the first opening.

2. The expansion card fixing structure of claim 1, wherein a quantity of the at least one guide track is two, the guide tracks are arranged at intervals, the expansion plate further comprises two the guide portions, the two the guide portions are arranged at intervals along the second direction, each the guide portion is provided in the track slot.

3. The expansion card fixing structure of claim 1, the first end of the limiting element comprising a first bevel, the first bevel detachably abuts against the guide portion, the expansion plate moves in the first direction and pushes the first end upward in the third direction, so that the limiting element can avoid the expansion plate.

4. The expansion card fixing structure of claim 1, wherein a periphery of the avoidance hole in the second direction is an open structure, a peripheries of the avoidance hole in the first direction and the third direction are closed.

5. The expansion card fixing structure of claim 1, wherein the resilient member comprises a first connection end and a second connection end ranged at intervals along the first direction, the first connection end is connected to the limiting element, and the second connection end is fixedly connected to the track base.

6. The expansion card fixing structure of claim 5, wherein a thickness of the first end along the second direction is greater than a thickness of the second end along the second direction, the first end comprises a snap-in step at a junction of the first end and the second end, the first connection end is provided on the snap-in step and around the limiting element, the first connection end is provided on the side of the first end away from the track slot, the second connection end is fixedly connected to the track base.

7. The expansion card fixing structure of claim 1, wherein the handle is provided on a side of the limiting element away from the track slot, the handle further comprises two fixed walls, the two the fixed walls are arranged at intervals in the second direction, the second end is provided between the two the fixed walls, the latch extends through the second end and the two the fixed walls.

8. The expansion card retaining structure of claim 1, wherein the first surface is connected with the second surface, a value of the difference between the distance from the second surface to the latch and the distance from the first surface to the latch is greater than a thickness of the expansion plate in the third direction.

9. The expansion card fixing structure of claim 1, wherein a guide hole is defined on the track base, the guide hole extends in the third direction, the guide hole is communicated with the track slot, the guide hole is configured to receive the limiting element, the guide hole is configured to guide the limiting element, at least a portion of the limiting element is located outside the guide holes.

10. An electronic device comprising a main board, a connection port and an expansion card fixing structure, the expansion card fixing structure comprising:
at least one guiding track comprising a track base, wherein a track slot is defined on the track base, the track slot extends in a first direction, and a side of the track base is recessed in a second direction to form the track slot;
a limiting element comprising a first end and a second end, the first end and the second end being arranged at intervals in a third direction, wherein the first end is inserted into the track slot in the third direction, an avoidance hole is defined on the second end in the second direction, the avoidance hole extends in the third direction;
a handle comprising a first surface and a second surface, wherein the handle is connected to the second end by a latch, the latch is partially received in the avoidance hole, the handle is rotatable around an axis of the latch, and one of the first surface and the second surface is in contact with the track base, a distance from the first surface to the latch is less than a distance from the second surface to the latch;
a resilient member connected to the first end and the track base, the resilient member being configured for driving the first end into the track slot;
an expansion plate comprising at least one guide portion, wherein a first opening is defined on the at least one guide portion, the guide portion is moveably inserted in the track slot, the first opening is located in the track slot, and the expansion plate is lockable by inserting the first end into the first opening; and
the expansion card fixing structure being connected to the main board through the connection port.

11. The electronic device of claim 10, wherein a quantity of the at least one guide track is two, the guide tracks are arranged at intervals, the expansion plate further comprises two the guide portions, the two the guide portions are arranged at intervals along the second direction, each the guide portion is provided in the track slot.

12. The electronic device of claim 10, the first end of the limiting element comprising a first bevel, the first bevel detachably abuts against the guide portion, the expansion plate moves in the first direction and pushes the first end upward in the third direction, so that the limiting element can avoid the expansion plate.

13. The electronic device of claim 10, wherein a periphery of the avoidance hole in the second direction is an open structure, a peripheries of the avoidance hole in the first direction and the third direction are closed.

14. The electronic device of claim 10, wherein the resilient member comprises a first connection end and a second connection end ranged at intervals along the first direction, the first connection end is connected to the limiting element, and the second connection end is fixedly connected to the track base.

15. The electronic device of claim 14, wherein a thickness of the first end along the second direction is greater than a thickness of the second end along the second direction, the first end comprises a snap-in step at a junction of the first end and the second end, the first connection end is provided on the snap-in step and around the limiting element, the first connection end is provided on the side of the first end away from the track slot, the second connection end is fixedly connected to the track base.

16. The electronic device of claim 10, wherein the handle is provided on a side of the limiting element away from the track slot, the handle further comprises two fixed walls, the two fixed walls are arranged at intervals in the second direction, the second end is provided between the two the fixed walls, the latch extends through the second end and the two the fixed walls.

17. The electronic device of claim 10, wherein the first surface is connected with the second surface, a value of the difference between the distance from the second surface to the latch and the distance from the first surface to the latch is greater than a thickness of the expansion plate in the third direction.

18. The electronic device of claim 10, wherein a guide hole is defined on the track base, the guide hole extends in the third direction, the guide hole is communicated with the track slot, the guide hole is configured to receive the limiting element, the guide hole is configured to guide the limiting element, at least a portion of the limiting element is located outside the guide holes.

* * * * *